(12) United States Patent
Zaal et al.

(10) Patent No.: US 7,426,011 B2
(45) Date of Patent: Sep. 16, 2008

(54) METHOD OF CALIBRATING A LITHOGRAPHIC APPARATUS AND DEVICE MANUFACTURING METHOD

(75) Inventors: Koen Jacobus Johannes Maria Zaal, Eindhoven (NL); Antonius Johannes De Kort, Veldhoven (NL); Frederik Eduard De Jong, Eindhoven (NL); Koen Goorman, Eindhoven (NL); Boris Menchtchikov, Eindhoven (NL); Hermen Folken Pen, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 443 days.

(21) Appl. No.: 11/223,209

(22) Filed: Sep. 12, 2005

(65) Prior Publication Data

US 2007/0058152 A1    Mar. 15, 2007

(51) Int. Cl.
    *G03B 27/42* (2006.01)
(52) U.S. Cl. ............................ 355/53; 355/72; 355/77; 378/34
(58) Field of Classification Search .................... 355/53, 355/72, 75, 77; 378/34, 35
    See application file for complete search history.

(56) References Cited

U.S. PATENT DOCUMENTS 4,509,852 A    4/1985   Tabarelli et al.
6,159,644 A    12/2000  Satoh et al.
2002/0012858 A1  1/2002  Kawakubo et al.
2003/0223630 A1  12/2003 Adel et al.
2004/0207824 A1  10/2004 Lof et al.
2005/0259234 A1  11/2005 Hirukawa et al.
2006/0033892 A1  2/2006  Cadee et al.
2006/0033898 A1  2/2006  Cadee et al.
2006/0119820 A1  6/2006  Hirukawa

FOREIGN PATENT DOCUMENTS

| EP | 0 895 279   |    | 2/1999 |
| EP | 1 420 300   | A2 | 5/2004 |
| EP | 1 571 697   |    | 9/2005 |
| EP | 1 628 161   |    | 2/2006 |
| WO | WO 99/49504 |    | 9/1999 |
| WO | 03/071471   |    | 8/2003 |
| WO | 2004/053955 |    | 6/2004 |

OTHER PUBLICATIONS

European Search Report for EP Appl. No. 06254621.3-1226 issued Dec. 19, 2006.

*Primary Examiner*—Della J. Rutledge
(74) *Attorney, Agent, or Firm*—Pillsbury Winthrop Shaw Pittman, LLP

(57) ABSTRACT

In calibration of overlay performance of an immersion lithographic apparatus, two sets of overlay data are obtained from exposures carried out using normal and reversed meanders. The two data sets can then be used to eliminate effects due to wafer cooling.

25 Claims, 4 Drawing Sheets

Fig. 8
Fig. 9
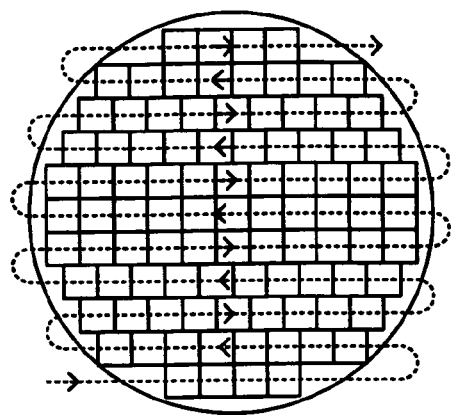
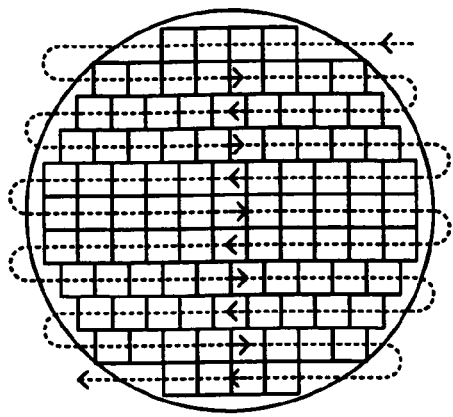
Fig. 10
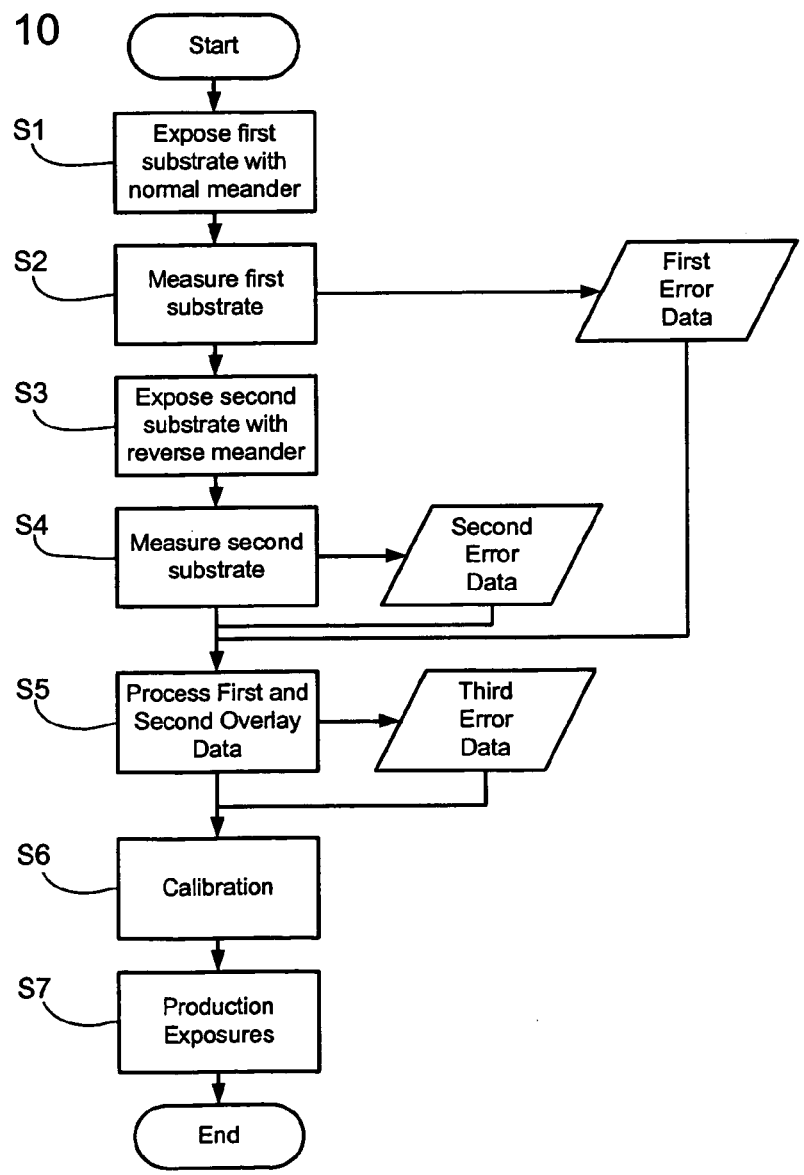

METHOD OF CALIBRATING A LITHOGRAPHIC APPARATUS AND DEVICE MANUFACTURING METHOD

FIELD

The present invention relates to a method of calibrating a lithographic apparatus and a method for manufacturing a device using the calibrated apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein.

However, submersing the substrate or substrate and substrate table in a bath of liquid (see for example U.S. patent U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application no. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

All lithographic apparatus require at least some calibration before use and the higher the resolution of the apparatus, in general, the more calibration steps will be required to get the best possible performance from the apparatus. An important performance measure of a lithographic apparatus is its overlay performance, which measures the ability of the apparatus to image a pattern on a substrate at a desired position relative to an existing pattern on the substrate. Overlay errors may be caused by a variety of causes, for example systematic errors in interferometric position or displacement measuring systems. To calibrate the overlay performance of a lithographic apparatus, a series of test structures are printed, normally across the whole of a substrate, and the position of the test structures is measured. The test structures may, for example, be alignment markers so that their positions can be measured using an alignment tool provided in the apparatus, or may be overlay sensitive structures, such as box-in-box markers, whereby overlay errors can be directly measured using a known off-line tool. The result is a map of overlay errors across the area of a substrate which can be used to calibrate the apparatus, e.g. by using them as offsets when positioning the substrate during production exposures.

SUMMARY

However, it has been determined that in an immersion lithography apparatus, that is a lithography apparatus in which at least part of the space between the final element of the projection system and the substrate is filled with a high-refractive index liquid, some overlay errors are caused by substrate cooling effects. As such these errors are not only dependent on position but also on the history of the test exposure sequence. Thus, if overlay errors measured in the conventional way are used to calibrate the apparatus, overlay errors will not be eliminated and may indeed be made worse.

Accordingly, it would be advantageous, for example, to provide an improved method of calibrating a lithographic apparatus.

According to an aspect of the invention, there is provided a method of calibrating a lithographic projection apparatus having a projection system, the method comprising:

printing a first set of test structures on a substrate, the substrate traveling a first course relative to the projection system to effect the printing of the first set of test structures;

printing a second set of test structures on a substrate, the substrate traveling a second course relative to the projection system to effect the printing of the second set of test structures, the second course being different than the first course;

measuring positional errors in the first set of test structures to obtain a first set of position error data;

measuring positional errors in the second set of test structures to obtain a second set of position error data;

calculating a third set of position error data from the first and second sets of position error data; and calibrating the lithographic projection apparatus using the third set of position error data.

According to an aspect of the invention, there is provided a device manufacturing method using a lithographic projection having a projection system, the method comprising:

calibrating the lithographic projection apparatus by:

printing a first set of test structures on a substrate, the substrate traveling a first course relative to the projection system to effect the printing of the first set of test structures;

printing a second set of test structures on a substrate, the substrate traveling a second course relative to the projection system to effect the printing of the second set of test structures, the second course being different than the first course;

measuring positional errors in the first set of test structures to obtain a first set of position error data;

measuring positional errors in the second set of test structures to obtain a second set of position error data;

calculating a third set of position error data from the first and second sets of position error data;

calibrating the lithographic projection apparatus using the third set of position error data; and using the lithographic apparatus to print device patterns on substrates.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 8 depicts a normal meander path;

FIG. 9 depicts a meander path traveled in the opposite direction; and

FIG. 10 is a flow chart of a method according to the invention.

DETAILED DESCRIPTION

Figure 1:
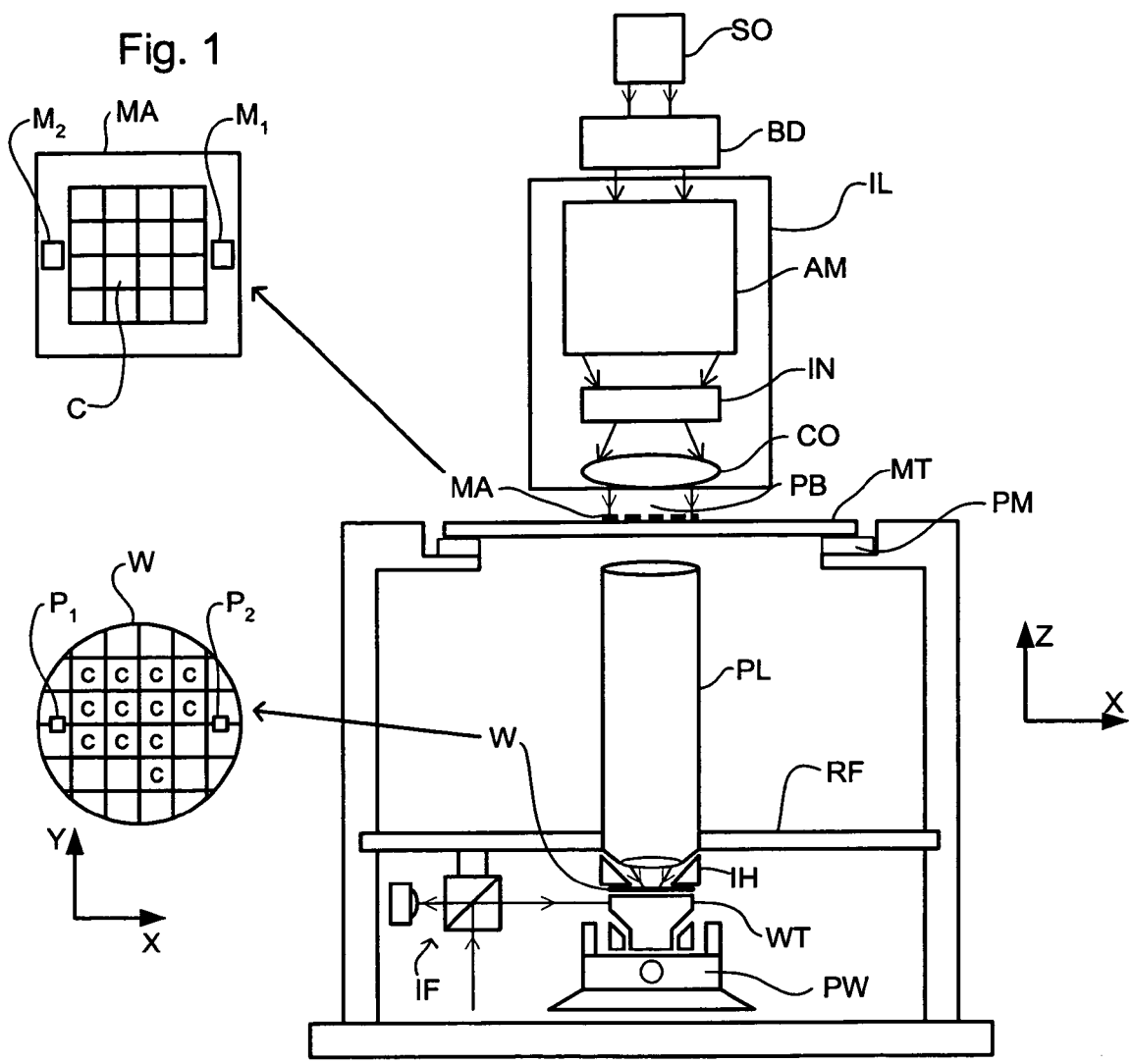
FIG. 1 depicts a lithographic apparatus usable in an embodiment of the invention.
Figure 2:
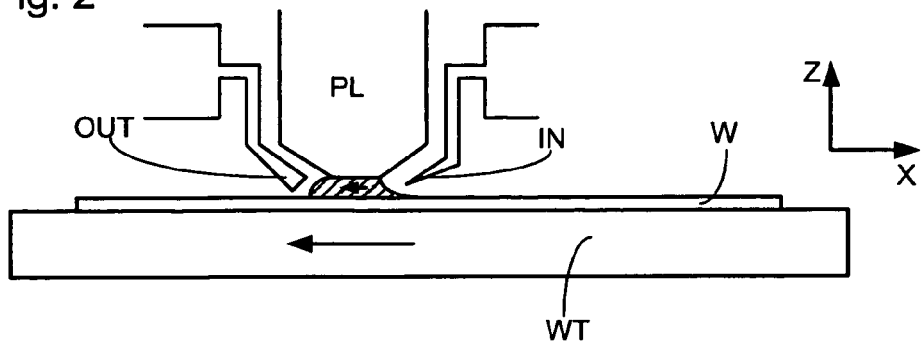
FIGS. 2 and 3 depict a conventional liquid supply system for use in a lithographic projection apparatus.
Figure 3:
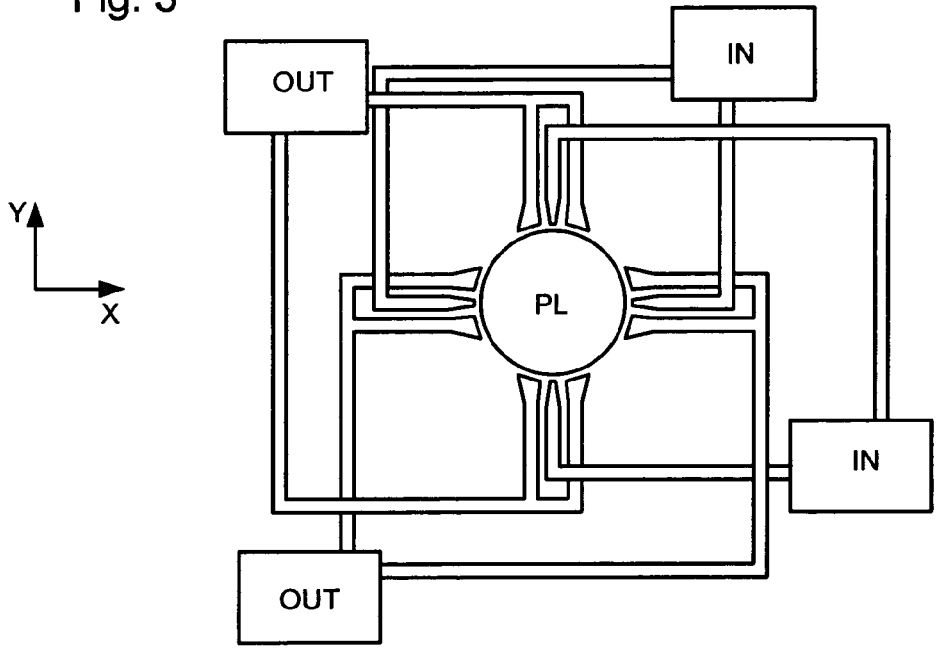

FIG. 1 schematically depicts a lithographic apparatus usable in an embodiment of the invention. The apparatus comprises:

an illumination system (illuminator) IL configured to condition a radiation beam PB (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. An immersion hood IH, which is described further below, supplies immersion liquid to a space between the final element of the projection system PL and the substrate W.

With the aid of the second positioner PW and position sensor IF (e.g. an interferometric device, linear encoder or capacitive sensor), the substrate table WT can be moved-accurately, e.g. so as to position different target portions C in the path of the radiation beam PB. Similarly, the first positioner PM and another position sensor (which is not explicitly depicted in FIG. 1) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
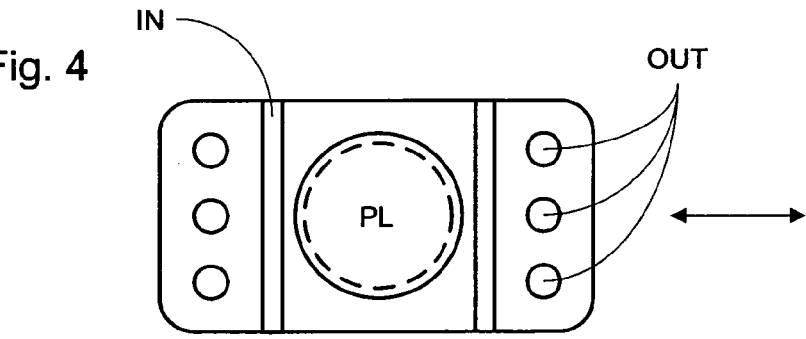
FIG. 4 depicts another liquid supply system for use in a lithographic projection apparatus.
Figure 4:
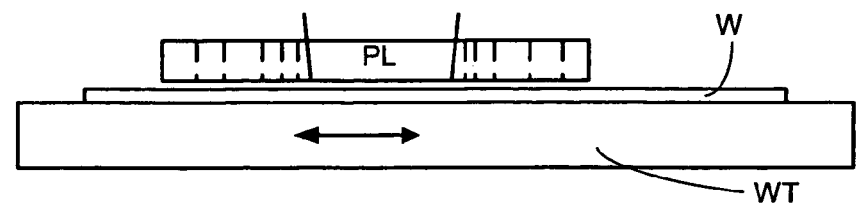

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and outlets OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
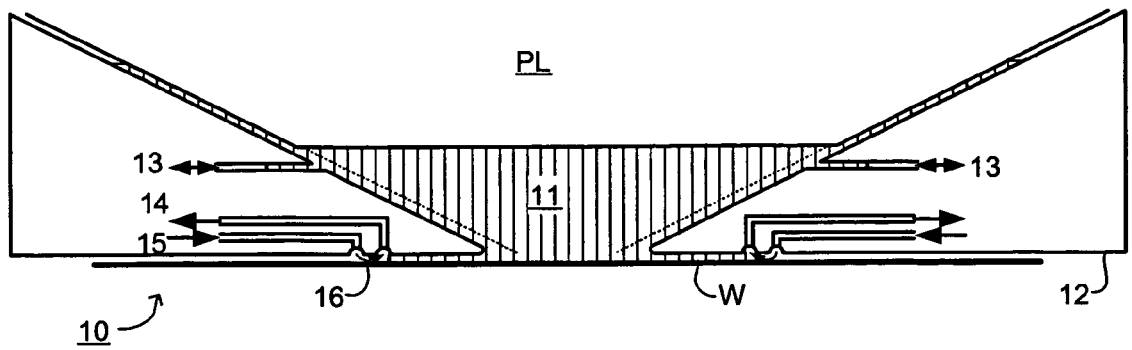
FIG. 5 depicts another liquid supply system for use in a lithographic projection apparatus.

Another immersion lithography solution with a localized liquid supply system solution which has been proposed is to provide the liquid supply system with a seal member which extends along at least a part of a boundary of the space between the final element of the projection system and the substrate table. Such a solution is illustrated in FIG. 5. The seal member is substantially stationary relative to the projection system in the XY plane though there may be some relative movement in the Z direction (in the direction of the optical axis). A seal is formed between the seal member and the surface of the substrate.

Referring to FIG. 5, reservoir 10 forms a contactless seal to the substrate around the image field of the projection system so that liquid is confined to fill a space between the substrate surface and the final element of the projection system. The reservoir is formed by a seal member 12 positioned below and surrounding the final element of the projection system PL. Liquid is brought into the space below the projection system and within the seal member 12. The seal member 12 extends a little above the final element of the projection system and the liquid level rises above the final element so that a buffer of liquid is provided. The seal member 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the seal member 12 and the surface of the substrate W. The gas seal is formed by gas, e.g. air or synthetic air but, in an embodiment, $N_2$ or another inert gas, provided under pressure via inlet 15 to the gap between seal member 12 and substrate and extracted via first outlet 14. The overpressure on the gas inlet 15, vacuum level on the first outlet 14 and geometry of the gap are arranged so that there is a high-velocity gas flow inwards that confines the liquid. Such a system is disclosed in United States patent application no. U.S. Ser. No. 10/705,783, hereby incorporated in its entirety by reference.

Some overlay errors of immersion-type lithographic projection apparatus are due to thermal effects, especially the cooling of the substrate due to evaporation of residual immersion liquid, e.g. water, left on a target portion after it has been exposed through the immersion liquid. These errors are not solely position dependent, as are some other systematic overlay errors in lithographic apparatus, but also depend on the history of exposures of the substrate—the course (path and direction) and speed of the substrate during the preceding exposures.

Figure 6:
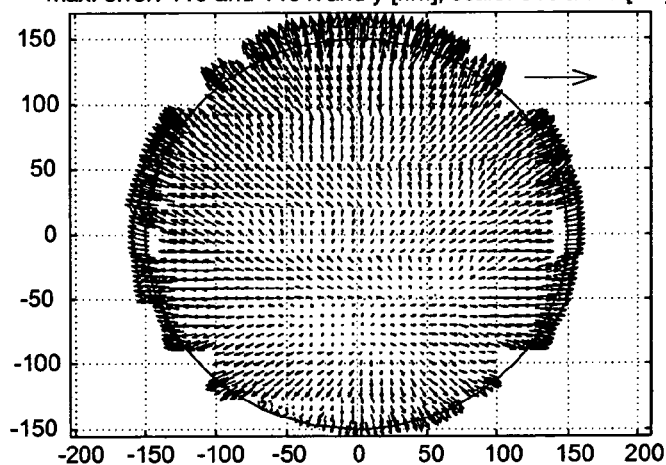
FIG. 6 depicts a first set of overlay error data obtained in carrying out an embodiment of the invention.
Figure 7:
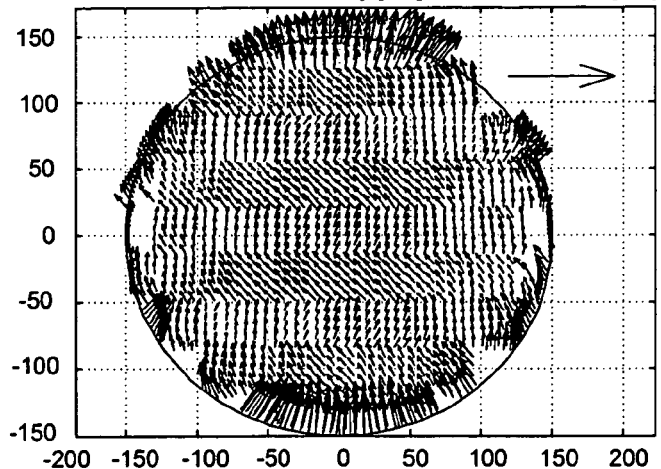
FIG. 7 depicts a third set of overlay error data obtained in carrying out an embodiment of the invention.

This is confirmed by FIGS. 6 and 7, which show experimental data obtained from a finite element analysis simulating thermal effects. In particular, FIG. 6 depicts overlay error data resulting from thermal effects caused by the cooling of the substrate due to the passage of the substrate under a liquid supply system, especially due to the evaporation of residual immersion liquid, e.g. water, from the substrate after printing of a target portion. The data simulates results of carrying out a normal meander scan, as depicted in FIG. 8, starting at the bottom left of the wafer. A similar set of data simulating a reversed meander scan shown in FIG. 9, starting in the top right of the wafer and following the same course in reverse, was obtained. FIG. 7 shows the result of subtracting these two sets of data, from which a significant change can be seen, allowing identification, and hence separate correction, of wafer cooling related overlay errors.

From FIG. 7 it can be concluded that by obtaining overlay error data from scans carried out in opposite directions, overlay errors resulting from thermal effects and dependent on exposure history can be identified and hence separated from other systematic and random errors. Calibration of the apparatus can then be performed using only the systematic errors, leading to increased accuracy.

A flowchart of a method according to the invention is given in FIG. 10. A first substrate is exposed S1 while traveling along a first course with a first set of test structures, for example overlay-sensitive markers or markers such as alignment markers whose position can be easily determined, and measured S2 to obtain a first set of error data, which may be overlay data or position data that can be processed to overlay data. A second set of test structures, preferably identical to the first set, is then exposed S3 onto the same or a different substrate using a second course different to the first course, which was used to expose the first set of test structures. The second set of structures are then measured to obtain a second set of error data.

In a particular embodiment the first test structures are printed in a predetermined order—the first row (bottom) is printed, e.g., left to right and subsequent rows are printed in alternating directions to form a so-called meander pattern. In a scanner, that is a lithographic apparatus in which each target portion is printed whilst the substrate and pattern are scanned relative to the projection lens, successive target portions are scanned in opposite directions, due to the need to be at full scanning speed at the beginning of each scan and to stop and reverse the mask (if used) between target portions. Thus an additional back-and-forth movement of the substrate is superimposed on the meander path. For clarity, this movement has been omitted from FIGS. 8 and 9.

For each target portion of the exposure of the second set of test structures, the same scanning direction can be used as for the corresponding target portion of the first set of test structures. This ensures that intra-target portion cooling effects are the same, assisting in isolation of the global (whole substrate) cooling effects. Alternatively, the scanning direction for each target portion can be reversed between the first and second test structures, with or without reversal of the overall meander. Performing multiple sets of measurements with various different combinations of changes to the exposure order and scan direction can enable isolation, and hence compensation for, various different forms of local and global cooling effects.

The course used for the second set of test structures may be opposite in the sense that it follows the same path but in the opposite direction (time reversal), that is a mirror image of the first course in a plane perpendicular to the substrate or that it is a rotation of the first course about an axis passing though the center of the substrate, or a combination of these. The second course should be traveled at the same speed as the first course.

Exposure and measurement of the first and second sets of test structures may take place in either order and measurements may be taken in parallel with exposures if the measurements are taken using a stand-alone tool or at the measurement station of a dual stage apparatus. The first and second sets of test structures may be exposed and measured a plurality of times on the same or different substrates and the results averaged to reduce the effect of random errors.

The first and second error data are then processed S5 to obtain a third set of error data that can be used in calibration S6 of the apparatus before production exposure S7 are performed. The processing of the first and second data sets to obtain the third data set may be a simple subtraction of the two data sets or a more complex calculation, dependent on the exact form of the thermal overlay errors expected.

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, where applicable, the invention may take the form of a computer program containing one or more sequences of machine-readable instructions describing a method as disclosed above, or a data storage medium (e.g. semiconductor memory, magnetic or optical disk) having such a computer program stored therein.

The present invention can be applied to any immersion lithography apparatus, in particular, but not exclusively, those types mentioned above. The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used. However, it is to be understood that embodiments of the present invention may be used with other types of liquid in which case such water-related terms should be considered replaced by equivalent terms relating to the immersion liquid used.

The descriptions above are intended to be illustrative, not limiting. Thus, it will be apparent to one skilled in the art that modifications may be made to the invention as described without departing from the scope of the claims set out below.

The invention claimed is:

1. A method of calibrating a lithographic projection apparatus having a projection system, the method comprising:
    printing a first set of test structures on a substrate, the substrate traveling a first course relative to the projection system to effect the printing of the first set of test structures;
    printing a second set of test structures on a substrate, the substrate traveling a second course relative to the projection system to effect the printing of the second set of test structures, the second course being different than the first course;
    measuring positional errors in the first set of test structures to obtain a first set of position error data;
    measuring positional errors in the second set of test structures to obtain a second set of position error data;
    calculating a third set of position error data from the first and second sets of position error data; and
    calibrating the lithographic projection apparatus using the third set of position error data.

2. A method according to claim 1 wherein the first and second test structures are printed in a series of target portions arranged in a plurality of rows on said substrate,
    the first test structures are printed by printing the target portions in a predetermined order and the second test structures are printed by printing the target portions in an order that is the reverse of the predetermined order.

3. A method according to claim 2 wherein each target portion is printed by scanning the substrate relative to the projection system in a respective scan direction, which may differ from target portion to target portion, and for each target portion the same scan direction is used for printing the first and second test structures.

4. A method according to claim 2 wherein each target portion is printed by scanning the substrate relative to the projection system in a respective scan direction, which may differ from target portion to target portion, and for each target portion opposite scan directions are used for printing the first and second test structures.

5. A method according to claim 3 further comprising printing a third set of test structures on each of said target portions in an order that is the reverse of the predetermined order and using respective scanning directions that are opposite to the scanning directions used to print the first and second set of test structures.

6. A method according to claim 1 wherein the first course comprises a meander path along which the first substrate travels in a first direction and the second course comprises the meander path along which the second substrate travels in a second direction opposite to the first direction.

7. A method according to claim 1 wherein the second course is substantially the same as a mirror image of the first course.

8. A method according to claim 1 wherein the second course is substantially the same as a rotation by 180° of the first course.

9. A method according to claim 1 wherein calculating the third set of positional error data comprises taking a difference between the first and second sets of position error data.

10. A method according to claim 1 wherein the printing of the first and second sets of test structures and the measuring of positional errors therein are each repeated a plurality of times to obtain the first and second sets of positional error data.

11. A method according to claim 1 wherein the first and second test structures are printed on the same substrate.

12. A method according to claim 1 wherein the first and second test structures are printed on different substrates.

13. A method according to claim 1 wherein the lithographic projection apparatus is of an immersion type.

14. A method according to claim 1 wherein the first and second sets of positional error data are sets of overlay error data.

15. A device manufacturing method using a lithographic projection having a projection system, the method comprising:
    calibrating the lithographic projection apparatus by:
        printing a first set of test structures on a substrate, the substrate traveling a first course relative to the projection system to effect the printing of the first set of test structures;
        printing a second set of test structures on a substrate, the substrate traveling a second course relative to the projection system to effect the printing of the second set of test structures, the second course being different than the first course;
        measuring positional errors in the first set of test structures to obtain a first set of position error data;
        measuring positional errors in the second set of test structures to obtain a second set of position error data;
        calculating a third set of position error data from the first and second sets of position error data;
        calibrating the lithographic projection apparatus using the third set of position error data; and
        using the lithographic apparatus to print device patterns on substrates.

16. A method according to claim 15 wherein the first and second test structures are printed in a series of target portions arranged in a plurality of rows on said substrate,
    the first test structures are printed by printing the target portions in a predetermined order and the second test structures are printed by printing the target portions in an order that is the reverse of the predetermined order.

17. A method according to claim 16 wherein each target portion is printed by scanning the substrate relative to the projection system in a respective scan direction, which may differ from target portion to target portion, and for each target portion the same scan direction is used for printing the first and second test structures.

18. A method according to claim 16 wherein each target portion is printed by scanning the substrate relative to the projection system in a respective scan direction, which may differ from target portion to target portion, and for each target portion opposite scan directions are used for printing the first and second test structures.

19. A method according to claim 17 further comprising printing a third set of test structures on each of said target portions in an order that is the reverse of the predetermined order and using respective scanning directions that are opposite to the scanning directions used to print the first and second set of test structures.

20. A method according to claim 15 wherein calculating the third set of positional error data comprises taking a difference between the first and second sets of position error data.

21. A method according to claim 15 wherein the printing of the first and second sets of test structures and the measuring of positional errors therein are each repeated a plurality of times to obtain the first and second sets of positional error data.

22. A method according to claim 15 wherein the first and second test structures are printed on the same substrate.

23. A method according to claim 15 wherein the first and second test structures are printed on different substrates.

24. A method according to claim 15 wherein the lithographic projection apparatus is of an immersion type.

25. A method according to claim 15 wherein the first and second sets of positional error data are sets of overlay error data.

* * * * *